United States Patent [19]

Hsia

[11] 4,454,648
[45] Jun. 19, 1984

[54] METHOD OF MAKING INTEGRATED MNOS AND CMOS DEVICES IN A BULK SILICON WAFER

[75] Inventor: Yukun Hsia, Santa Ana, Calif.

[73] Assignee: McDonnell Douglas Corporation, Long Beach, Calif.

[21] Appl. No.: 356,082

[22] Filed: Mar. 8, 1982

[51] Int. Cl.³ .............. H01L 29/78; H01L 21/265; B01J 17/00
[52] U.S. Cl. .................. 29/576 B; 29/571; 29/577 C; 29/578; 148/1.5; 148/187; 357/42; 357/91
[58] Field of Search .............. 148/1.5, 187; 29/576 B, 29/577 C, 571, 578; 357/42, 91

[56] References Cited

U.S. PATENT DOCUMENTS

| | | | |
|---|---|---|---|
| 3,920,481 | 11/1975 | Hu | 148/1.5 |
| 4,217,149 | 8/1980 | Sawazaki | 148/1.5 |
| 4,244,752 | 1/1981 | Henderson et al. | 148/1.5 |
| 4,268,321 | 5/1981 | Meguro | 148/1.5 |
| 4,285,116 | 8/1981 | Meguro | 29/571 |
| 4,306,916 | 12/1981 | Wollesen et al. | 148/1.5 |
| 4,315,781 | 2/1982 | Henderson | 148/1.5 |
| 4,325,180 | 4/1982 | Curran | 29/571 |
| 4,342,149 | 8/1982 | Jacobs et al. | 29/576 B |
| 4,373,253 | 2/1983 | Khadder et al. | 29/576 B |

Primary Examiner—Upendra Roy
Attorney, Agent, or Firm—Gregory A. Cone; George W. Finch; Donald L. Royer

[57] ABSTRACT

This combination process enables both MNOS and CMOS devices to be fabricated upon the same wafer in very large scale integration systems. Conventional moat isolation techniques are replaced with low temperature ion implantation processing to accomplish substrate isolation. Both n and p channel MOS transistor diffusions and field oxidations are processed concurrently. Also, this process utilizes bulk silicon wafer material rather than epitaxial wafer material as the substrate.

20 Claims, 8 Drawing Figures

METHOD OF MAKING INTEGRATED MNOS AND CMOS DEVICES IN A BULK SILICON WAFER

BACKGROUND OF THE INVENTION

1. Field of the Invention

This invention relates to the fabrication of semiconductor devices. Still more particularly, this invention relates to the integrated fabrication on a single wafer of both MNOS and CMOS devices by a combination of diffusion and ion implantation techniques.

2. Description of the Prior Art

Known present processes for the fabrication of metal nitride oxide silicon (MNOS) memory transistors require the use of epitaxial silicon wafers for the substrate material. However, normal MOS devices are usually fabricated in bulk silicon wafers. The cost differential between these two types of substrate starting materials is, at present, $5.00 per wafer for bulk silicon versus $15.00 to $20.00 per wafer for epitaxial silicon wafers. Additionally, in order to achieve peripheral circuit operation during the time when the MNOS transistors are accessed for memory erase, the peripheral circuits must be isolated from the MNOS substrate due to the high voltages involved in the memory erase operation for the MNOS transistors. This isolation is normally accomplished by isolation moat diffusions which require high temperatures and long diffusion time periods for their implementation. For these and other reasons, it has not been cost competitive to combine MNOS transistor technology with other typical MOS technologies on the same wafer.

Complimentary metal oxide semiconductor (CMOS) devices offer the important advantages of relatively high access speed, low power dissipation and radiation tolerance. Until relatively recently, most all MNOS large scale integration (LSI) devices and circuits have been based on p channel MOS technology. However, within the last few years, MNOS transistor devices have been successfully implemented in n channel MOS technology as well. This has created the potential for the fabrication of MNOS memory transistors based upon the CMOS technology.

SUMMARY OF THE INVENTION

Briefly, the process comprises first forming a p well in a bulk silicon wafer of n conductivity type; then depositing p and n doping materials in preselected regions on the surface of the wafer which will form source, drain and contact regions; then implanting p and n dopants in preselected regions of the substrate; then forming a field oxide layer over the substrate; then uncovering the various source, drain and well contact regions as well as the gate regions for the various MOS and MNOS transistors; then forming the MOS and MNOS gates; and, finally, forming electrical contacts with each of the source, drain, well contact and gate regions on the wafer.

It is an object of this invention to employ less expensive bulk silicon wafers as the starting point for a combined MNOS/CMOS fabrication process.

It is another object of this invention to replace the undesirable isolation diffusion process with ion implantation techniques for substrate isolation in this MNOS/CMOS process.

It is yet another object of this invention to concurrently process both n and p channel MOS transistor diffusions and field oxidations.

It is yet another object of this invention to combine the separate MNOS and CMOS technologies into a MNOS/CMOS fabrication process.

DETAILED DESCRIPTION OF THE INVENTION

The particular embodiment described in detail below is implemented in n conductivity-type bulk silicon wafer. This being the case, the descriptions of the various conductivity types of the particular regions as they are fabricated in the wafer are necessarily described as either n or p conductivity regions. However, the process of this invention can also be applied to the fabrication of semiconductor devices in p conductivity type silicon wafers with a corresponding reversal of the conductivity types compared to the process as described for an n conductivity bulk silicon wafer. Other process variations are, of course, possible. The true scope of this invention in which an exclusive privilege is claimed will be found in the appended claims.

EMBODIMENT NO. 1

Figure 1:
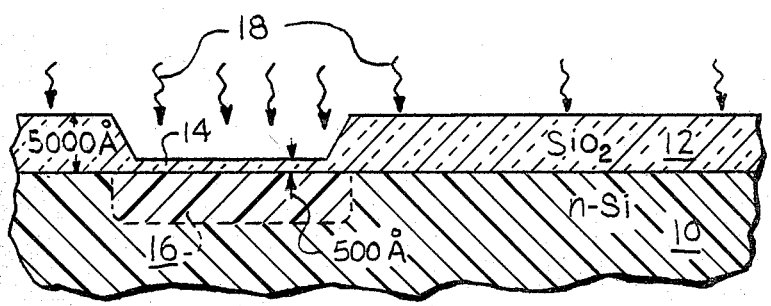
FIGS. 1 to 6 are cross-sectional views of a portion of a larger wafer into which are being emplaced various circuit elements by the process of this invention, the views being taken at various steps during the process.

The process of this embodiment of the invention begins with the inspection and selection of a suitable n conductivity type bulk silicon wafer having a resistivity of from about 3 to about 5 ohm-centimeters with a crystal orientation of 100. The selected wafer is then cleaned and subjected to an initial oxidation step, during which is formed a silicon dioxide layer on the surface of the wafer having a thickness of approximately 5,000 Å. This oxidized layer is then covered with a photoresist layer which will determine the location of the various wells within the wafer. The well areas are then etched through the initial oxidation layer to the surface of the substrate. The photoresist is then stripped off and the wafer is cleaned. At this point a pre implantation oxide layer is grown on the wafer, producing a thin oxide layer of about 500 Å in thickness. This oxide layer gives better boundary definition for the succeeding ion implantation step and provides for superior ion distribution at the surface after implantation. The p conductivity implant is then done. Conditions of 60 KeV for a concentration of about $10^{13}$ Borons per $cm^2$ have been found to be satisfactory. The wafer is then cleaned. A cross-sectional view through a portion of a wafer at this stage of the process is shown in FIG. 1. This figure shows the bulk n-Si wafer 10 covered by the initial oxide layer 12 with a pre implant oxide 14 in the well region of the wafer at the surface. The ion implantation 18 introduces ions into the well region 16 of the substrate.

The process now moves to a well drive step in which the implanted ions in the well 16 are subjected to a period of heating (1200° C. for about 16 hours) in a nitrogen atmosphere. After this step, the wafer is then again cleaned and then reoxidized to approximately the same thickness as the initial oxide layer.

Figure 2:
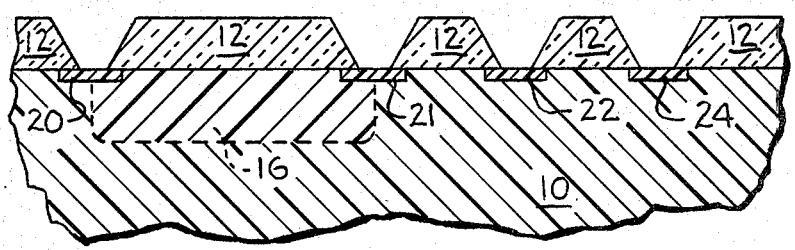

The next step in the process is the p diffusion mask step. A photoresist layer is emplaced upon the regrown oxide and the areas marking the p impurity type diffusion regions are etched away, exposing the surface of the substrate. The photoresist is then stripped, the wafer is cleaned, and a predeposition step is done. The deposition step deposits boron impurities onto and into the surface of the substrate 10 in the various regions exposed by the p diffusion mask. This step is illustrated by FIG. 2 which shows the various openings which have been etched into the field oxide layer 12 and into which have been deposited the various p diffusion substances marked by the areas 20, 21, 22 and 24. The next step is a so-called dip step in which the boron-contaminated silicon dioxide is stripped away. The wafer is then cleaned and an oxide layer is again reoxidized to approximately a thickness of 4,000 to 5,000 Å.

Figure 3:
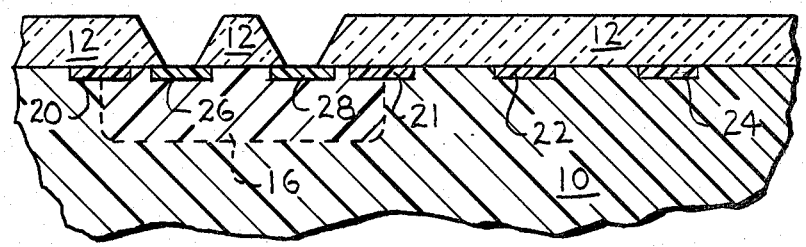

The next step in the process involves the emplacement of the n diffusion regions. Again, first a photoresist layer, the n diffusion mask, is emplaced onto the reoxidized layer 12. The various n diffusion regions are then etched away, exposing the underlying substrate. The photoresist is then stripped, and the wafer is cleaned in preparation for the phosphorous deposition which introduces the n impurities into the selected areas of the surface of the wafer. The phosphorous deposition is conducted at 1000° C. in this embodiment. This deposition step is followed by another dip step in which the phosphorous contaminated oxide layer on top of the surface of the substrate is stripped away. This point of the process is illustrated in FIG. 3. This figure shows the two regions of the oxide 12 which have been stripped away to expose the substrate and through which the n impurity, here phosphorous, has been introduced into the substrate in the regions marked 26 and 28.

At this point the oxide 12 is completely stripped away and is replaced by another oxide layer, here termed a pre-implant oxide, which is a layer of silicon dioxide approximately 500 Å in thickness. At this point the n channel field mask is laid down. Appropriate portions of the photoresist layer are stipped away and the n channel field implant step is done in which boron ions are implanted at an energy level of about 150 KeV to a density of about $1.8 \times 10^{13}$ boron ions per square centimeter. This photoresist layer is then stripped away and the p channel field mask step is done. In this step a new photoresist layer with the p channel field mask is laid down and stripped away in the appropriate areas. Next the phosphorous ions are ion implanted at an energy level of about 150 KeV to a density of about $2 \times 10^{12}$ phosphorous ions per square centimeter. This p channel field mask photoresist layer is then stripped away and the wafer is cleaned. This cleaning step strips off all of the remaining oxide layer down to the surface of the substrate 10.

The next step involves the growth of a new field oxidation layer on the surface of the substrate. This layer is grown at about 925° C. in steam for about 19 hours to a thickness of about 1.3 microns. This heat acts also to diffuse the n and p impurities in the diffusion regions into the substrate and further deepen the p well. This step is followed by an oxide implant step in which the field oxide layer is bombarded with ions at energy level of about 60 KeV to a density of $2 \times 10^{12}$ phosphorous ions per square centimeter. The purpose of this oxide implant is to damage the surface of the oxide such that in subsequent deposition steps the damaged portions of the field oxide will erode away. The edges of the field oxide will then assume larger radii of curvature, thereby improving the quality of the metal deposition onto these relatively sharp edges in later steps.

Figure 4:
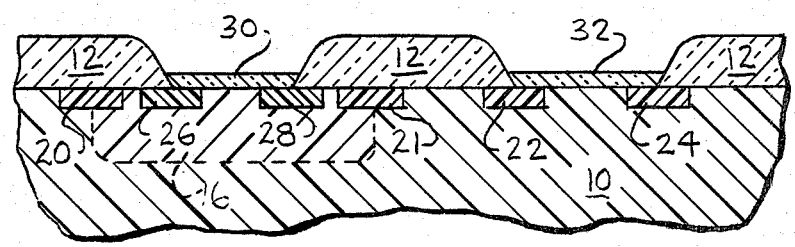

Next in the process comes the gate mask step. First a photoresist layer is laid down, marking the regions of the field oxide which will be etched away to expose the surface of the surface of the substrate which will define the various gates of the transistors on the wafer. These etched away areas are then stripped and cleaned and a gate oxide is then grown on the exposed surface of the substrate at a temperature of about 1,000° C. This step is shown in FIG. 4. Here the gate regions have been etched away and gate oxide layers 30 and 32 have been deposited upon the surface of the substrate 10.

Optionally, at this point in the process, if any depletion mode transistor devices are desired, a depletion mask should be laid down and a depletion ion implantation should be conducted.

The next step in the process involves the formation of the MNOS implant mask. A photoresist layer is laid down with openings therein which expose the memory regions of the MNOS transistor gate areas. An MNOS implant is then done at about 20 KeV to a density of about $2 \times 10^{13}$ boron ions per square centimeter. This MNOS implant into the substrate determines the threshold voltage of the MNOS devices at a consistent and controllable level.

Figure 5:
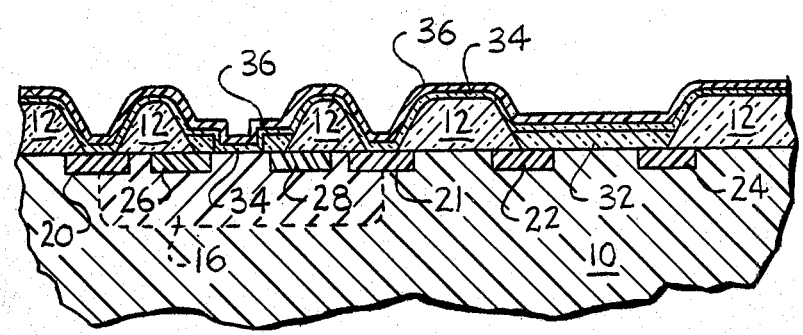

The next step in the process involves the memory and contact mask. A photoresist layer is laid down, and those portions of the substrate overlaying the memory regions of the MNOS transistors and the other various contact regions on the wafer are exposed. The wafer is then stripped and cleaned prior to the formation of a thin memory oxide layer onto the wafer. This memory oxide layer is normally about 20 Å in thickness. The memory oxide formation step is followed by the deposition of a silicon nitride layer on top of the memory oxide layer. FIG. 5 shows the process at this point in its sequence. This figure shows that the p well contact regions 20 and 21 have been opened through the field oxide layer 12. Further, the gate oxide layer 30 of the MNOS transistor has been stripped away in the memory region. This figure also shows that the memory oxide layer 34 and the silicon nitride layer 36 have been formed over the surface of the wafer.

The silicon nitride mask photoresist is then laid down. This photoresist will protect only the gate regions of the MNOS transistors on the wafer from the following plasma etch step which will strip away all of the silicon nitride layer 36 and the memory oxide layer 34 from the remainder of the surface of the wafer. The silicon nitride mask photoresist is then stripped away and the surface of the wafer is cleaned. Following this is a silicon nitride annealing step to form the silicon nitride layer gate dielectric of the MNOS memory transistors. The wafer is then again cleaned.

Figure 6:
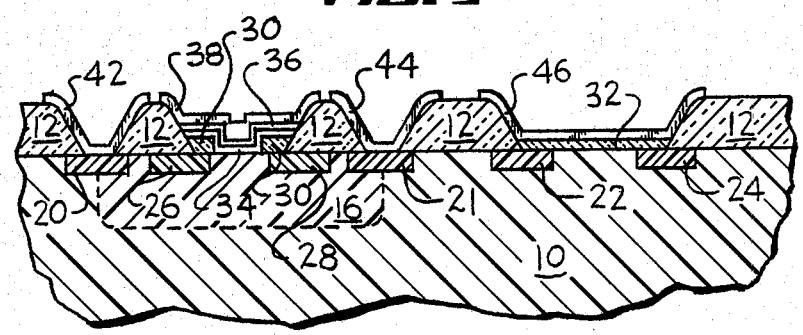

The next step in the process is the deposition of an aluminum layer over the surface of the wafer to a depth of about 1 micron. Then an aluminum mask photoresist layer is laid down which will protect only those areas of the aluminum metallization which are necessary to remain on the surface of the wafer, namely, the various interconnects and contacts. The superfluous aluminum is then etched away, and the remaining photoresist is removed. This point in the process is shown by FIG. 6. This figure shows that the silicon nitride layer 36 and the memory oxide layer are now confined solely to the gate region of the MNOS transistor shown on this portion of the wafer and that the various aluminum metallizations have now been confined to their various contact areas. Aluminum metallizations 42 and 44 define the p well electrical contacts; aluminum metallization 38 is the gate electrode for the MNOS transistor shown in this figure, and aluminum metallization 46 is the gate electrode for the MOS transistor shown in this figure. Source and drain contacts for the two transistors are out of the plane of section.

Following this comes an optional leakage implant designed to prevent stray current conduction which is sometimes a problem in MNOS transistor arrays. This leakage implant is largely self-aligned and is not shown in FIG. 6. It would be conducted at an energy level of about 60 KeV to a density of about $10^{13}$ boron ions per square centimeter. Following the optional leakage implant step, the wafer is again cleaned and the wafer is then subjected to an alloy step in which it is heated to about 450° C. for about 30 minutes in an $N_2$ atmosphere. The wafer is again cleaned.

Following this cleaning, the wafer then has a passivation layer emplaced upon its surface, normally by a chemical vapor deposition (CVD) process which emplaces either silicon nitride or silicon dioxide uniformally over the surface of the wafer. Contact pads at the periphery of the wafer would then be defined by another photoresist layer. The passivation layer would be etched away to expose the contact areas with their aluminum metallization, or, optionally, polysilicon electrodes. The wafer would then finally be stripped and cleaned and prepared for testing.

EMBODIMENT NO. 2

This embodiment differs from Embodiment No. 1 in the step following the depositions of the n and p fields wherein a new field oxide layer is formed. In Embodiment No. 1 this new field oxide is grown by a high temperature process (925° C. for 19 hours) in a steam atmosphere. This causes the various implants and diffusions to be fairly deeply driven into the wafer. This also results in relatively large feature size devices.

In this second embodiment, the high temperature process of Embodiment No. 1 is replaced with a low temperature chemical vapor deposition step for the formation of the new field oxide layer. In this new step the new field oxide layer is deposited upon the wafer rather than grown. The wafer is placed in a partial atmosphere comprising silane ($SiH_4$) and oxygen at about 350°-410° C. for about 4 hours. Silicon dioxide precipitates out of the gas phase onto the surface of the wafer. This CVD step could utilize silicon-bearing gas compounds such as dichlorosilane ($SiCl_2H_2$) and the like which reacts to form silicon dioxide in the presence of oxygen under low temperature conditions in the place of silane. Variations in temperature, time and pressure are also possible, the overall goal of this step being to deposit a uniform layer of silicon dioxide upon the surface of the wafer. Since this is a low temperature process, the diffusions and implants from the prior steps are not driven into the substrate as deeply (nor as far laterally) as in the corresponding step in Embodiment No. 1. For this reason, the minimum feature size of the devices can be reduced to about 4 microns and below.

In order to achieve the 4 microns and below feature sizes, in place of typical chemical etching of aluminum, a plasma etch is additionally utilized. The reaction is based on the chemical reaction $Al + 3Cl \rightarrow AlCl_3$ in a parallel plate plasma etcher which results in an isotropic etching of the Al, thus providing fine line width definition of the Al interconnect on the wafer.

These two specific steps in this embodiment result in significantly improved geometric control of device features which permits device feature sizes of 4 microns and below.

Figure 7:
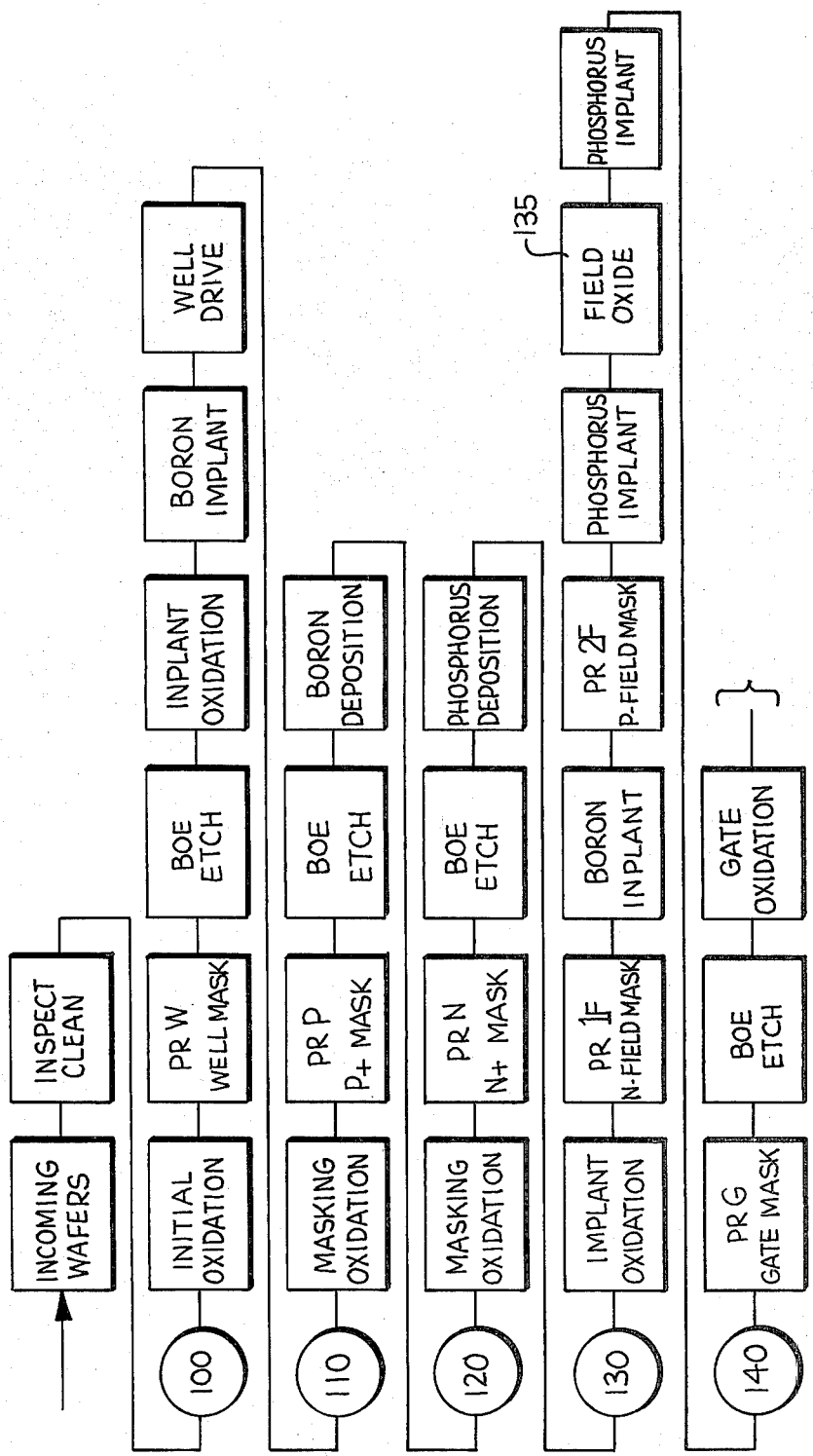
FIGS. 7 and 8 are modularized process flow charts for this invention.
Figure 8:
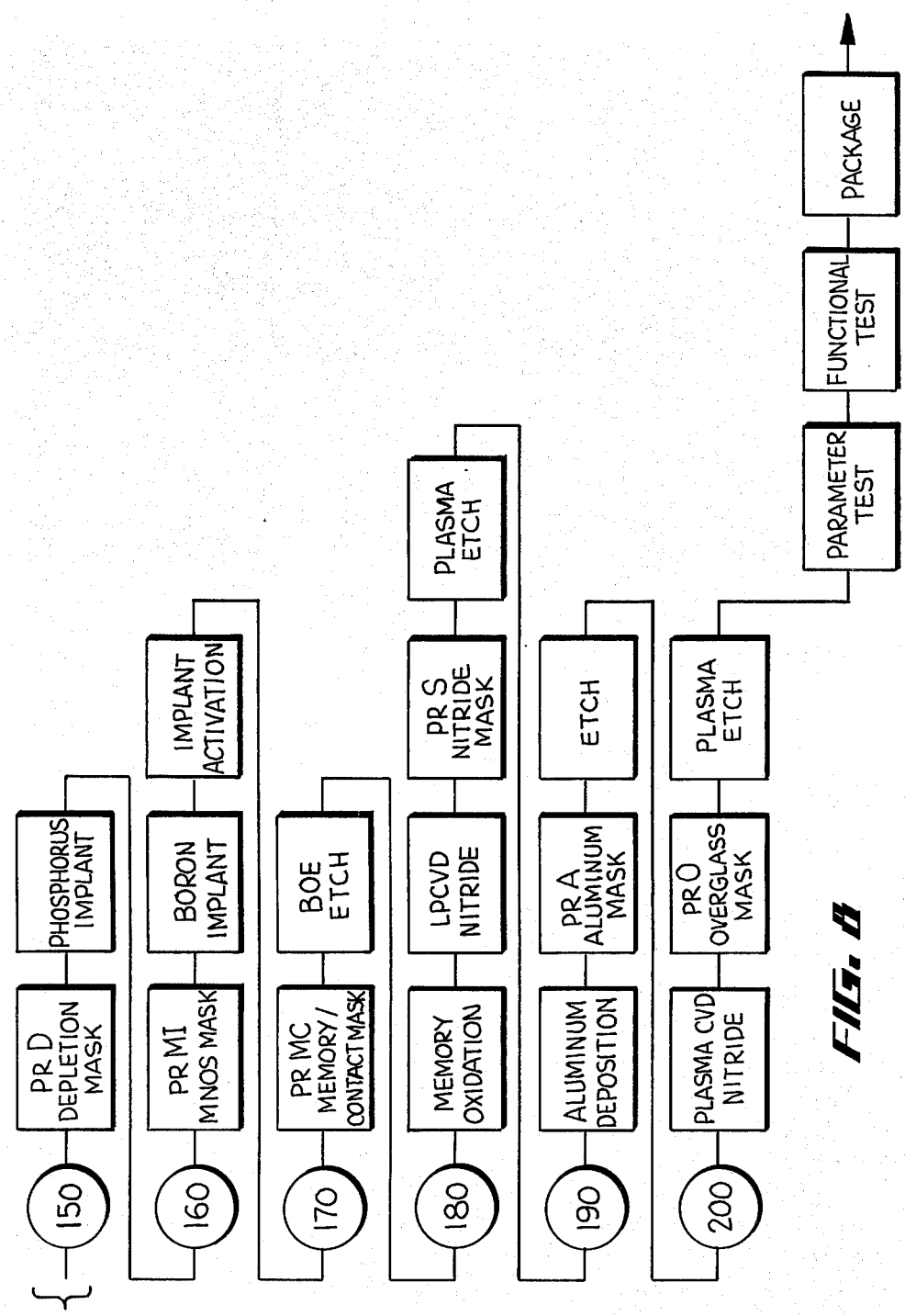

FIGS. 7 and 8 describe the process steps of this invention. Step 100 covers the formation of the wells in the wafer. Step 110 covers the p impurity deposition. Step 120 covers the n impurity deposition. Step 130 covers the n and p field implant steps and the growth of the new field oxide. This new field oxide step 135 masks the one significant process step difference between the two embodiments with Embodiment No. 1 employing a high temperature growth process and Embodiment No. 2 employing a low temperature chemical vapor deposition process. Step 140 covers the formation of the transistor gates on the wafer. Step 150 is the optional step required for creating depletion mode transistors on the wafer. Step 160 covers the MNOS memory implant. Step 170 covers formation of the memory gates and additional contact areas on the wafer. Step 180 covers the formation of the memory oxide layer and the silicon nitride layer on the wafer. Step 190 covers the aluminum metallization and includes an etching step to remove excess aluminum. This could be done by a conventional chemical etch process in Embodiment No. 1. However, Embodiment No. 2 requires that the plasma etching process, described above, be used to achieve the small feature sizes possible with this embodiment. Step 200 covers the deposition of the passivation layer and subsequent uncovering of the wafer contact pads.

I claim:
1. An MNOS/CMOS transistor fabrication process comprising:
   forming at least one well of a first conductivity type in a semiconductor wafer of a second conductivity type by ion implantation; then,
   depositing doping materials of the first and second conductivity types into respective preselected regions of the surface of the wafer wherein such regions will comprise source, drain, and contact regions of opposite conductivity type to the implanted ions of this step; then,
   implanting ions of the first and second conductivity types into preselected fields intermediate certain of the preselected regions; then,
   forming a field oxide layer over substantially all of the surface of the wafer; then,
   exposing preselected gate regions on the surface of the substrate and covering these gate regions with a gate oxide layer; then,
   implanting ions of the first conductivity type into those gate regions which have been preselected as MNOS transistor gate regions; then,
   exposing at least a portion of the surface of the substrate in the MNOS transistor gate regions and then covering the gate regions with first a memory oxide layer and then a silicon nitride layer; then,
   exposing preselected contact areas on the surface of the substrate; and then,
   forming electrical interconnects and contacts with the contact areas and the gate regions.
2. The process of claim 1 further comprising implanting ions of the first conductivity type into the surface of the substrate in preselected gate regions such that depletion mode transistors will be formed.

3. The process of claim 1 wherein the field oxide is formed by heating the wafer to at least 800° C. for at least 10 hours, and preferably to about 925° C. for about 19 hours, in an atmosphere comprising steam.

4. The process of claim 1 wherein the field oxide is formed by a low temperature chemical vapor deposition step comprising exposing the wafer to an atmosphere comprising a gaseous compound selected from the group consisting of silane, dichlorosilane, other silicon-bearing gaseous compounds and mixtures thereof, and oxygen at a temperature less than about 550° C. such that the silicon component of the gaseous compound will combine with the oxygen to form a substantially uniform layer of silicon dioxide upon the surface of the wafer.

5. The process of claim 4 wherein the gaseous compound comprises silane and the temperature is from about 350° C. to about 400° C. for a time period of from about 3 to about 5 hours.

6. The process of claim 1 wherein the electrical interconnects and contacts are implemented as aluminum metallization layers.

7. The process of claim 6 wherein the formation of the aluminum electrical interconnects and contacts includes an etch step comprising an anisotropic plasma etching process.

8. The process of claim 1 wherein the semiconductor wafer comprises a silicon wafer.

9. The process of claim 8 wherein the silicon wafer surface comprises bulk silicon wafer.

10. The process of claim 1 wherein the first conductivity type is p conductivity type and the second conductivity type is n conductivity type.

11. The process of claim 1 wherein the first conductivity type is n conductivity type and the second conductivity type is p conductivity type.

12. An MNOS/CMOS transistor fabrication process comprising:

forming at least one well of a first conductivity type in a bulk silicon wafer of a second conductivity type by ion implantation; then, depositing doping materials of the first and second conductivity types into preselected regions of the surface of the wafer wherein such regions will comprise source, drain, and contact regions; then, implanting ions into the first and second conductivity types into respective preselected fields intermediate certain of the preselected regions of opposite conductivity type to the implanted ions of this step; then, forming a field oxide layer over substantially all of the surface of the wafer by a process comprising heating the wafer to at least 800° C. for at least 10 hours, and preferably to about 925° C. for about 19 hours, in an atmosphere comprising steam; then, exposing preselected gate regions on the surface of the substrate and covering these gate regions with a gate oxide layer; then, implanting ions of the first conductivity type into those gate regions which have been preselected as MNOS transistor gate regions; then, exposing at least a portion of the surface of the substrate in the MNOS transistor gate regions and then covering the gate regions with first a memory oxide layer and then a silicon nitride layer; then, exposing preselected contact areas on the surface of the substrate; and then, forming electrical interconnects and contacts with the contact area and the gate regions.

13. The process of claim 12 wherein the first conductivity type is p conductivity type and the second conductivity type is n conductivity type.

14. The process of claim 12 wherein the first conductivity type is n conductivity type and the second conductivity type is p conductivity type.

15. An MNOS/CMOS transistor fabrication process comprising:

forming at least one well of a first conductivity type in a bulk silicon wafer of a second conductivity type by ion implantation; then, depositing doping materials of the first and second conductivity types into preselected regions of the surface of the wafer, wherein such regions will comprise source, drain, and contact regions; then, implanting ions of the first and second conductivity types into respective preselected fields intermediate certain of the preselected regions of opposite conductivity type to the implanted ions of this step; then, forming a field oxide layer over substantially all of the surface of the wafer by a process comprising a low temperature chemical vapor deposition process comprising exposing the wafer to an atmosphere comprising a gaseous compound selected from the group consisting of silane, dichlorosilane, other silicon-bearing gaseous compounds and mixtures thereof, and oxygen at a temperature less than about 550° C. such that the silicon component of the gaseous compound will combine with the oxygen to form a substantially uniform layer of silicon dioxide upon the surface of the wafer; then, exposing preselected gate regions on the surface of the substrate and covering these regions with a gate oxide layer; then, implanting ions of the first conductivity type into those gate regions which have been preselected as MNOS transistor gate regions; then, exposing at least a portion of the surface of the substrate in the MNOS transistor gate regions and then covering the gate regions with first a memory oxide layer and then a silicon nitride layer; then, exposing preselected contact areas on the surface of the substrate; and then, forming electrical interconnects and contacts with the contact areas and the gate regions.

16. The process of claim 15 wherein the gaseous compound comprises silane and the temperature is from about 350° C. to about 400° C. for a time period of from about 3 to about 5 hours.

17. The process of claim 15 wherein the electrical interconnects and contacts are implemented as aluminim metallization layers.

18. The process of claim 17 wherein the formation of the aluminum electrical interconnects and contacts includes an etch step comprising an anisotropic plasma etching process.

19. The process of claim 15 wherein the first conductivity type comprises p conductivity type and the second conductivity type comprises n conductivity type.

20. The process of claim 15 wherein the first conductivity type is n conductivity type and the second conductivity type is p conductivity type.

* * * * *